United States Patent
Steinmann et al.

(10) Patent No.: US 11,161,981 B2
(45) Date of Patent: Nov. 2, 2021

(54) ONE-COMPONENT, STORAGE-STABLE, UV-CROSSLINKABLE ORGANOSILOXANE COMPOSITION

(71) Applicant: ELANTAS Beck GmbH, Hamburg (DE)

(72) Inventors: Andreas Steinmann, Hamburg (DE); Kim Bastian Bebenroth, Hamburg (DE)

(73) Assignee: ELANTAS Beck GmbH, Hamburg (DE)

( * ) Notice: Subject to any disclaimer, the term of this patent is extended or adjusted under 35 U.S.C. 154(b) by 172 days.

(21) Appl. No.: 15/780,987

(22) PCT Filed: Dec. 1, 2016

(86) PCT No.: PCT/EP2016/079383
§ 371 (c)(1),
(2) Date: Jun. 1, 2018

(87) PCT Pub. No.: WO2017/093375
PCT Pub. Date: Jun. 8, 2017

(65) Prior Publication Data
US 2018/0355176 A1 Dec. 13, 2018

(30) Foreign Application Priority Data
Dec. 3, 2015 (DE) .......................... 102015224193.9

(51) Int. Cl.
| | |
|---|---|
| *C08L 83/04* | (2006.01) |
| *H01L 23/29* | (2006.01) |
| *C08K 5/05* | (2006.01) |
| *C08K 5/56* | (2006.01) |
| *C08L 83/00* | (2006.01) |
| *B01J 31/22* | (2006.01) |
| *C08G 77/08* | (2006.01) |
| *C08G 77/20* | (2006.01) |
| *C08G 77/12* | (2006.01) |

(52) U.S. Cl.
CPC ........... *C08L 83/04* (2013.01); *B01J 31/2295* (2013.01); *C08G 77/08* (2013.01); *C08K 5/05* (2013.01); *C08K 5/56* (2013.01); *C08L 83/00* (2013.01); *H01L 23/296* (2013.01); *C08G 77/12* (2013.01); *C08G 77/20* (2013.01); *C08L 2203/206* (2013.01)

(58) Field of Classification Search
CPC .......... C08G 77/12; C08G 77/20; B01J 23/40; C08L 83/04
See application file for complete search history.

(56) References Cited

U.S. PATENT DOCUMENTS

| | | | |
|---|---|---|---|
| 8,865,784 | B2 | 10/2014 | Shimakawa |
| 9,365,757 | B2 | 6/2016 | Mayumi et al. |

(Continued)

FOREIGN PATENT DOCUMENTS

| | | |
|---|---|---|
| DE | 69122625 T2 | 4/1997 |
| DE | 60037067 T2 | 9/2008 |
| DE | 102008000156 A1 | 7/2009 |
| DE | 102009002231 A1 | 10/2010 |
| EP | 0122008 A1 | 10/1984 |
| EP | 0146307 A2 | 6/1985 |
| EP | 0550239 A1 | 7/1993 |
| EP | 0561919 B1 | 2/1999 |
| EP | 0358452 B1 | 12/1999 |
| EP | 1817372 B1 | 9/2009 |
| EP | 2145912 A1 | 1/2010 |
| EP | 1699897 B1 | 10/2015 |
| JP | H07121837 A | 5/1995 |
| JP | 2015110752 A | 6/2015 |
| KR | 102010101010 A | 9/2010 |
| KR | 1020140109794 A | 9/2014 |
| WO | 2012041674 A1 | 4/2012 |
| WO | 2015006531 A1 | 1/2015 |
| WO | 2015056483 A1 | 4/2015 |

OTHER PUBLICATIONS

International Preliminary Report on Patentability for International Application No. PCT/EP2016/079383 dated Jan. 30, 2018 (8 pages).

(Continued)

*Primary Examiner* — Kuo Liang Peng
(74) *Attorney, Agent, or Firm* — Fitch, Even, Tabin & Flannery LLP

(57) ABSTRACT

The invention relates to the use as a coating or impregnating agent of an organosiloxane composition comprising a) 20 to 98.999989 wt % of at least one polyorganosiloxane comprising at least two alkenyl or alkynyl groups, as component A; b) 0.1 to 30 wt % of at least one linear or branched polyorganosiloxane comprising at least 3 Si—H groups, as component B; c) 0.000001 to 1 wt % of at least one UV-activatable, platinum-containing hydrosilylation catalyst, as component C; d) 0.00001 to 5 wt % of at least one alkynol of the general formula (I), where $R^1$, $R^2$ and $R^3$ independently of one another are selected from H, $C_1$-$C_6$ alkyl and $C_3$-$C_6$ cycloalkyl; or $R^1$ is selected from H, $C_1$-$C_6$ alkyl and $C_3$-$C_6$ cycloalkyl, and $R^2$ and $R^3$ are connected to one another and form a 3- to 8-membered ring, as component D; e) 0 to 79.899989 wt % of one or more polyorganosiloxanes comprising two terminal Si—H groups or one terminal Si—H group and one terminal alkenyl group, as component E; f) 0 to 20 wt % of one or more epoxy organosiloxanes, as component F; g) 0 to 5 wt % of one or more organosiloxanes, different from component A and having 1 to 5 Si atoms, and comprising at least two alkenyl groups, as component G; h) 0 to 79.899989 wt % of one or more silsesquioxanes, as component H; and i) 0 to 75 wt % of one or more additives, as component I; where the sum of components A to I is 100 wt %.

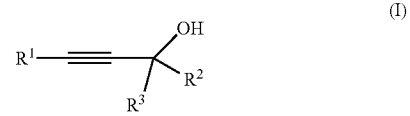

(I)

13 Claims, No Drawings

(56) References Cited

U.S. PATENT DOCUMENTS

| | | | |
|---|---|---|---|
| 9,714,344 B2 | 7/2017 | Mayumi et al. | |
| 2007/0131912 A1* | 6/2007 | Simone ................ | H05K 3/321 |
| | | | 252/500 |
| 2008/0033071 A1 | 2/2008 | Irmer et al. | |
| 2010/0256300 A1* | 10/2010 | Jandke ................... | C08L 83/04 |
| | | | 524/858 |
| 2010/0292361 A1 | 11/2010 | Koellnberger | |
| 2014/0291872 A1 | 10/2014 | Harkness et al. | |
| 2014/0315032 A1 | 10/2014 | Bebenroth et al. | |

OTHER PUBLICATIONS

International Search Report for International Application No. PCT/EP2016/079383 dated Aug. 3, 2017 (2 pages).

* cited by examiner

ONE-COMPONENT, STORAGE-STABLE, UV-CROSSLINKABLE ORGANOSILOXANE COMPOSITION

The invention relates to the use of a one-component organosiloxane composition having good storage stability at room temperature, which is crosslinkable to an elastomer by irradiation with UV light.

It is known that hydrogensiloxanes and aliphatically unsaturated compounds, especially vinyl-terminated polydimethylsiloxanes, react with one another in the presence of a hydrosilylation catalyst. For this reason, formulations comprising these constituents are customarily stored in two-component form, with one component comprising the hydrogensiloxane and a part of the aliphatically unsaturated component, and the other component comprising the hydrosilylation catalyst and the other part of the aliphatically unsaturated component. Before the reaction, the two components are mixed with one another. It would therefore be desirable if all three constituents in a mixture could be stored at room temperature without the reaction commencing, and if within this period the reaction could be initiated by irradiation with ultraviolet light or other actinic radiation.

EP 0 122 008 A1 describes the use of a UV-activatable platinum complex for catalysing the hydrosilylation in a composition consisting of a hydrogensiloxane, an aliphatic, unsaturated component and the platinum complex with a ligand removable by UV radiation. Platinum complexes used are particular diolefin-aryl-platinum complexes.

DE 10 2008 000 156 A1 describes UV-activatable hydrosilylation catalysts comprising platinum with various ligands based on cyclopentadiene. Also described is a formulation composed of the hydrosilylation catalyst, a hydrogensiloxane and an aliphatic, unsaturated component.

EP 0 146 307 A2 describes likewise UV-activatable hydrosilylation catalysts comprising platinum with various ligands based on cyclopentadiene.

EP 0 358 452 B1 describes UV-activatable hydrosilylation catalysts comprising platinum and ligands based on cyclopentadiene, which are able to absorb and be activated in the visible range as well through addition of anthracene or xanthones as sensitizers.

EP 0 561 919 describes a hydrosilylation process wherein, further to the UV-activatable hydrosilylation catalyst, a radically cleaving initiator is also present, and so hydrosilylation and radical crosslinking proceed simultaneously.

DE 600 37 067 T2 describes photoactive cyclopentadienylplatinum(IV) compounds as UV-activatable hydrosilylation catalysts, and also compositions comprising a hydrogensiloxane, an aliphatic, unsaturated component and the hydrosilylation catalyst.

DE 691 22 625 T2 describes a process for hydrosilylation in the presence of cyclopentadienyl-platinum complexes as UV-activatable hydrosilylation catalysts, α, α-diketones or α, α-ketoaldehydes as radical photoinitiators, and polycyclic aromatic hydrocarbons as sensitizers for visible light.

DE 10 2009 002 231 A1 describes a self-adhering, UV-curable silicone gel. The good adhesion is achieved through the addition of α-silane-type adhesion promoters, e.g. glycidyloxymethyltrimethoxysilane.

US 2014/0291872 A1 describes a heat-stable, UV-curable silicone gel. The good heat stability is achieved through the addition of ferrocene compounds.

WO 2012/041674 A1 describes a method for enhancing the adhesion of UV-curable silicone compositions by pretreating the substrate surface with a primer composition composed of reactive silanes and a platinum complex compound as UV-sensitive crosslinking catalyst.

US 2014/0315032 A1 discloses a one-component, solvent-free organosiloxane composition comprising a) a linear or branched polyorganosiloxane, containing at least two alkenyl or alkynyl groups, b) a linear or branched polyorganosiloxane, containing at least 3 Si—H groups, c) a platinum-based hydrosilylation catalyst, d) an alkynol and e) a pyrogenic silicon dioxide. The composition is applied to an electrical or electronic component by means of a cross-cut nozzle and is cured to a protective coating by heating to a temperature of 50 to 110° C.

It is an object of the invention to provide a process for applying a protective compound to an electric or electronic component wherein a mixture is used which is storage-stable at room temperature and comprises a siloxane having aliphatic, at least monounsaturated radicals, a siloxane which contains Si—H bonds, and a hydrosilylation catalyst, said mixture being crosslinkable by irradiation with UV light.

The object is achieved by providing an organosiloxane composition, applying the organosiloxane composition to an electrical or electronic component, and irradiating the organosiloxane composition with UV light to enable the curing of the composition The organosiloxane composition comprises:

a) 20 to 99.899989 wt % of at least one linear or branched polyorganosiloxane comprising at least two alkenyl or alkynyl groups, as component A;

b) 0.1 to 30 wt % of at least one linear or branched polyorganosiloxane comprising at least 3 Si—H groups, as component B;

c) 0.000001 to 1 wt % of at least one UV-activatable, platinum-containing hydrosilylation catalyst, as component C;

d) 0.00001 to 5 wt % of at least one alkynol of the general formula (I),

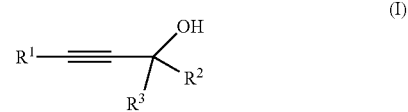

where $R^1$, $R^2$ and $R^3$ independently of one another are selected from H, $C_1$-$C_6$ alkyl and substituted or unsubstituted $C_3$-$C_6$ cycloalkyl; or $R^1$ is selected from H, $C_1$-$C_6$ alkyl and substituted or unsubstituted $C_3$-$C_6$ cycloalkyl, and $R^2$ and $R^3$ are connected to one another and form a 3- to 8-membered ring, preferably a $C_6$ ring, which may be substituted by one or more $C_1$-$C_3$ alkyl groups, as component D;

e) 0 to 79.899989 wt % of one or more polyorganosiloxanes comprising two terminal Si—H groups or one terminal Si—H group and one terminal alkenyl group, as component E;

f) 0 to 20 wt % of one or more epoxy organosiloxanes, as component F;

g) 0 to 5 wt % of one or more acyclic or cyclic organosiloxanes, different from component A and having 1 to 5 Si atoms, and comprising at least two alkenyl groups, as component G;

h) 0 to 79.899989 wt % of one or more silsesquioxanes, as component H; and i) 0 to 75 wt % of one or more additives, as component I;

where the sum of components A to I is 100 wt %.

In accordance with the process of the current invention, an alkynol additive is added to a formulation comprising a siloxane having aliphatic, at least monounsaturated radicals, a siloxane which contains Si—H bonds and a hydrosilylation catalyst, said alkynol additive reducing the catalyst activity to an extent such that the pot life at room temperature is extended to at least three months. It has been found that on irradiation with actinic radiation, more particularly UV radiation, the additive loses its activity-inhibiting effect.

The formulation of organosiloxanes which can be cured to a gel or a coating, in accordance with the invention, is a mixture which is vulcanizable catalytically by means of actinic radiation and which vulcanizes only after having been exposed to actinic radiation. It comprises a polyorganosiloxane having at least two alkenyl or alkynyl groups (component A), a polyorganosiloxane having at least 3 Si—H units (component B), a catalyst for the hydrosilylation (component C), and an additive which reduces the catalyst activity to an extent such that the pot life at room temperature is extended to at least three months and which loses its activity-inhibiting effect on UV irradiation (component D).

In one variant the formulation comprises a dihydrogenorganosiloxane or a monovinylmonohydrogenorganosiloxane (component E).

In another variant the formulation comprises structural inhibitors or moderators such as, for example, divinyltetramethyldisiloxane (CAS 2627-95-4) or tetramethyltetravinylcyclotetrasiloxane (CAS 2554-06-5) (component G).

In another variant the formulation comprises optionally functionalized siloxane resins, known as silsesquioxanes, such as, for example, vinyl-functional or Si—H-functional QM resins that are known to the skilled person (component H).

In another variant the formulation comprises one or more additives such as dyes, rheological additives, radiation-transparent fillers, flame retardants, plasticizers, adhesion promoters, fluorescers, etc. (component I).

Silicone formulations which comprise components A, B and C can normally be stored for a prolonged time only if they are stored in the form of two part-mixtures, of which one part-mixture comprises component B and the other part-mixture comprises component C. Prior to vulcanization, the two parts must be thoroughly mixed with one another. Here it is necessary to ensure that the mixing ratio is observed and that no air bubbles are incorporated by stirring. In the industrial sector, a mixing apparatus is required for this purpose. Moreover, in the event of a pause in production, there is a risk of the silicone formulation remaining in the mixing apparatus, crosslinking therein and thus blocking the apparatus. It is therefore advantageous if a one-component silicone formulation can be used. A silicone formulation which is storage-stable at room temperature for at least three months and which within that period can be vulcanized by irradiation with ultraviolet light or other actinic radiation is novel.

The activity-inhibiting effect of alkynols of the above-described type on platinum complexes is known. Such alkynols displace one or more of the original ligands of the platinum, thereby "poisoning" it. Hence the platinum catalyst is deactivated. If the platinum catalyst/alkynol ratio is large enough, the platinum catalyst is not completely deactivated, but instead is only inhibited. As a result, there is a reduction in the vulcanization rate of the hydrosilylation, allowing pot lives of several hours to be realized. In order to inhibit the hydrosilylation catalyst completely it is necessary to add an excess of alkynol. After that has been done, the catalyst can only be reactivated if the alkynol is removed from the platinum. This is normally accomplished by supply of thermal energy, leading to the decomposition of the alkynol or to its vaporization, as described in US 2014/0315032 A1.

The present invention relates to the use of a silicone formulation which comprises a UV-activatable platinum catalyst and an alkynol of the type described above. The alkynol is present in an amount which inhibits the catalyst completely. Entirely surprisingly it has been observed that the inhibition can be lifted by means of UV radiation.

The organosiloxane composition used in the present invention comprises as component A preferably at least one linear polyorganosiloxane, containing at least two alkenyl groups. The alkenyl groups are preferably vinyl groups, more preferably terminal vinyl groups.

In one preferred embodiment the organosiloxane composition used in the invention comprises as component A at least one linear polyorganosiloxane of the general formula (II),

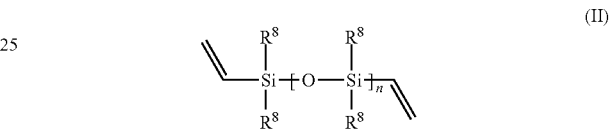

where
R$^8$ independently is selected from C$_1$-C$_6$ alkyl; and
n is a number from 6 to 1000.

In one particularly preferred embodiment, the organosiloxane composition used in the invention comprises as component A at least one linear polyorganosiloxane of the general formula (II) where R$^8$ is methyl.

The expression "C$_1$-C$_6$ alkyl" refers in the context of the present invention to the following group of alkyl groups: methyl, ethyl, n-propyl, isopropyl, n-butyl, isobutyl, sec-butyl, tert-butyl, n-pentyl, 3-methylbutyl, 2-methylbutyl, 1-methylbutyl, 1-ethypropyl, n-hexyl, 4-methylpentyl, 3-methylpentyl, 2-methylpentyl, 1-methylpentyl, 2-ethylbutyl, 1-ethylbutyl, 1,1-dimethylbutyl, 1,2-dimethylbutyl, 1,3-dimethylbutyl, 2,2-dimethylbutyl, 2,3-dimethylbutyl, 3,3-dimethylbutyl, 1,1,2-trimethylpropyl, 1,2,2-trimethylpropyl, 1-ethyl-1-methylpropyl, 1-ethyl-2-methylpropyl.

The composition used in the invention comprises preferably 20 to 99 wt %, more preferably 30 to 98 wt %, of component A.

The viscosity of the polyorganosiloxane of component A is generally from 20 to 200 000 mPa·s. The viscosity is preferably from 20 to 100 000 mPa·s, more preferably from 20 to 10 000 mPa·s.

The organosiloxane composition used in the invention comprises as component B preferably at least one linear or branched polyorganosiloxane comprising at least 3 Si—H groups. The composition used in the invention preferably comprises as component B at least one linear polydimethylsiloxane comprising at least 3 Si—H groups.

The organosiloxane composition used in the invention comprises preferably 0.1 to 30 wt %, preferably 0.2 to 15 wt %, more preferably 1 to 15 wt % of component B.

The viscosity of the polyorganosiloxane of component B is generally from 1 to 1000 mPa·s, preferably from 1 to 100 mPa·s and more preferably from 5 to 50 mPa·s.

The organosiloxane composition used in the invention comprises as component C a UV-activatable, platinum-containing hydrosilylation catalyst.

UV-activatable, platinum-containing hydrosilylation catalysts generally comprise an optionally substituted cyclopentadienyl group as ligand. Suitable such hydrosilylation catalysts comprising platinum and a cyclopentadienyl group are described inter alia in DE 691 22 625 T2.

Accordingly the hydrosilylation catalyst is an (eta$^5$-cyclopentadienyl)-tri(sigma-aliphatic)platinum complex of the formula:

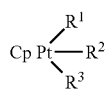
(I)

in which

Cp is an optionally substituted cyclopentadienyl group which is bonded in eta bonding to the platinum atom, the cyclopentadienyl group being unsubstituted or substituted by one or more groups;

$R^1$, $R^2$ and $R^3$ independently of one another are an aliphatic group having 1 to 18 carbon atoms, and the $R^1$, $R^2$ and $R^3$ groups are bonded in sigma bonding to the platinum atom.

$R^1$, $R^2$ and $R^3$ groups may be unsubstituted or substituted hydrocarbyl groups or unsubstituted or substituted acyl groups. The groups may be straight-chain, branched-chain or cyclic.

Representative examples of suitable (eta$^5$-cyclopentadienyl)-platinum complexes comprise the following, in which (Cp) represents the (eta$^5$-cyclopentadienyl) group:
  (Cp)trimethylplatinum
  (Cp)ethyldimethylplatinum
  (Cp)triethylplatinum
  (Cp)triallylplatinum
  (Cp)tripentylplatinum
  (Cp)trihexylplatinum
  (methyl-Cp)trimethylplatinum
  (trimethylsilyl-Cp)trimethylplatinum
  (phenyldimethylsilyl-Cp)trimethylplatinum
  (Cp)acetyldimethylplatinum.

Especially preferred is trimethyl(methylcyclopentadienyl)platinum (CAS 94442-22-5).

Other suitable photoactivatable, platinum-containing hydrosilylation catalysts are described for example in EP 0 122 008 A1, DE 1020 080 00156 A1, EP 0 146 307 A2, EP 0 358 452 B1 and DE 600 37 067 T2.

The organosiloxane composition used in the invention comprises preferably 0.000001 to 1 wt %, more preferably 0.0005 to 1 wt %, very preferably 0.001 to 0.5 wt % of component C.

The organosiloxane composition used in the invention comprises as component D preferably at least one alkynol of the general formula (I) wherein $R^1$, $R^2$ and $R^3$ independently of one another are selected from H, $C_1$-$C_6$ alkyl and substituted or unsubstituted $C_3$-$C_6$ cycloalkyl.

The expression "$C_3$-$C_6$ cycloalkyl" refers in the context of the present invention to the following group of cycloalkyl groups: cyclopropyl, cyclobutyl, cyclopentyl, cyclohexyl.

The organosiloxane composition used in the invention comprises as component D with particular preference at least one alkynol of the general formula (I) where $R^1$=H, $R^2$=methyl and $R^3$ is selected from $C_1$-$C_6$ alkyl, or $R^2$ and $R^3$ are connected to one another and form a cyclohexane ring. Very preferably the composition used in the invention comprises as component D at least one alkynol selected from 2-methyl-3-butyn-2-ol, 3,5-dimethyl-1-hexyn-3-ol and 1-ethynyl-1-cyclohexanol.

The organosiloxane composition used in the invention comprises 0.00001 to 5 wt %, preferably 0.001 to 3 wt %, more preferably 0.002 to 1 wt % of component D.

It has also been found that the structural viscosity of the composition used in the invention can be influenced through the addition of polyorganosiloxanes as per component E, comprising two terminal Si—H groups or one terminal Si—H group and one terminal alkenyl group. The structural viscosity may likewise be influenced through the addition of epoxy organosiloxanes as per component F.

One preferred embodiment of the composition used in the invention, accordingly, comprises 0.0001 to 79.899989 wt % of component E. In this case the composition used in the invention more preferably comprises 10 to 79 wt % and very preferably 20 to 78 wt % of component E.

With particular preference the composition used in the invention comprises as component E one or more polyorganosiloxanes of the general formula (II),

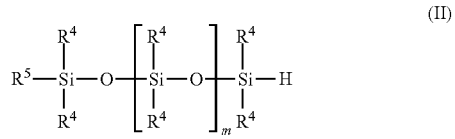
(II)

where
$R^4$ independently is selected from $C_1$-$C_6$ alkyl,
$R^5$ is selected from H and $C_2$-$C_6$ alkenyl, and
m is a number from 1 to 400.
$R^4$ is preferably methyl.
$R^5$ is preferably H or vinyl.
m is preferably a number from 2 to 400.

The viscosity of the polyorganosiloxane as per component E is generally from 1 to 10 000 mPa·s, preferably from 10 to 1000 mPa·s and more preferably from 10 to 50 mPa·s.

In one embodiment the organosiloxane composition used in the invention comprises one or more epoxyorganosiloxanes as component F. Suitable epoxy organosiloxanes are the polyepoxyorganosiloxanes described in paragraph [0076] of US 2014/0315032 A1.

Preference is given to glycidyloxypropyltrimethoxysilane.

The composition used in the invention comprises preferably 0.0001 to 20 wt %, more preferably 0.005 to 10 wt %, very preferably 0.01 to 5 wt % of component F.

It has further been found that the vulcanization time following irradiation with UV light of the composition used in the invention can be influenced further if, in addition to component E and/or component F, 0.0001 to 5 wt % of one or more acyclic or cyclic organosiloxanes, different from component A and having 1 to 5 Si atoms, and comprising at least two alkenyl groups, is added as structural inhibitor.

Accordingly, one embodiment of the composition used in the invention comprises 0.0001 to 5 wt % of one or more acyclic or cyclic organosiloxanes, different from component A and having 1 to 5 Si atoms, and comprising at least two alkenyl groups, as component G.

Particularly preferred as component G are siloxanes selected from the group consisting of 1,2-divinyltetramethyldisiloxane and 1,2,3,4-tetramethyl-1,2,3,4-tetravinyldimethyltricyclosiloxane.

The composition used in the invention in this embodiment comprises preferably 0.0001 to 5 wt %, more preferably 0.001 to 3 wt %, very preferably 0.01 to 1 wt % of component G.

In another embodiment the organosiloxane compositions used in the invention comprise 0 to 79.899989 wt % of one or more silsesquioxanes as component H.

These are VQM resins known to the skilled person. They are composed of
1. "Q pieces", these being silicon atoms bonded to 4 oxygen atoms (quaternary),
2. "M pieces" these being silicon atoms bonded only to 1 oxygen atom (mono). Of the remaining three valencies of the silicon, at least two bond to methyl groups. A third valency bonds either to a methyl group or to a vinyl group.

The structure of the VQM resins may also be described as nanoscale quartz particles which carry methyl and vinyl groups on the surface.

As component I, the organosiloxane compositions used in the invention may comprise customary additives, selected from the group consisting of dyes, rheological additives, radiation-transparent fillers, flame retardants, plasticizers, adhesion promoters and fluorescers. The fraction of component I is from 0 to 75 wt %.

In the compositions used in the invention the molar ratio of the Si—H groups to the Si-alkenyl groups is 0.3 to 5, preferably 0.5 to 2, more preferably 0.8 to 1.5.

A particularly preferred organosiloxane composition used in the present invention comprises
a) 20 to 98 wt % of component A,
b) 0.1 to 30 wt % of component B,
c) 0.000001 to 1 wt % of component C,
d) 0.00001 to 5 wt % of component D,
e) 0 to 79.899989 wt % of component E,
f) 0 to 2 wt % of component F,
g) 0 to 5 wt % of component G,
h) 0 to 79.899989 wt % of component H, and
i) 0 to 75 wt % of one or more additives as component I,
where the sum of components A to I is 100 wt %.

A subject of the present invention is a process for applying a protective organosiloxane coating to an electrical or electronic component, comprising the steps of
i) providing a one-component, solvent-free organosiloxane composition as defined above,
ii) applying—by means of a cross-cut nozzle, for example—the organosiloxane composition as a coating to an electrical or electronic component, and
iii) irradiating the organosiloxane composition with UV light, thereby forming, through hydrosilylation reaction, the protective organosiloxane coating on the electrical or electronic component.

In one embodiment the organosiloxane composition used in the present invention has a viscosity equal to or smaller than 10000 mPa·s at 25° C., preferably equal to or smaller than 5000 mPa·s at 25° C., even more preferred equal to or smaller than 1000 mPa·s at 25° C.

In one embodiment the organosiloxane composition used in the present invention is a one-component solvent-free organosiloxane composition. In a further embodiment, this composition is storage stable, which means that the viscosity of the mixture changes with less than 10% when stored for at least three months in a lightproof container.

The one-component, solvent-free organosiloxane composition may be applied by means of a cross-cut nozzle at a nozzle pressure of between 0.7 and 4.2 bar, provided the viscosity of the composition is smaller than 100 mPa·s at 25° C.

The UV crosslinking of the organosiloxane composition takes place in general by irradiation with UV light with a wavelength of 200 to 400 nm. The irradiation takes place preferably with a dose from 1000 to 7000 mJ/cm$^2$.

In the process of the invention, the one-component, solvent-free organosiloxane composition is preferably applied so as to form a protective organosiloxane coating having a film thickness of 0.1 to 250 μm.

The process of the invention is particularly suitable for applying a protective organosiloxane coating to a circuit board. In one preferred embodiment of the process of the invention, the one-component, solvent-free organosiloxane composition is applied in step b) to a circuit board.

Another subject of the present invention is the use of the organosiloxane for applying a UV-crosslinkable organosiloxane coating to electrical or electronic components.

The organosiloxane composition is used preferably for insulating electrical wires, for impregnating and for encapsulating of electrical windings, for coating circuit boards and electronic assemblies. Besides these uses, it may be used for the encapsulation and sealing of mechanical components, for the impregnation of fabrics and for the production of composite materials.

An additional subject of the invention is a protective organosiloxane coating obtainable by the process of the invention. The protective organosiloxane coating preferably has a film thickness of 0.1 to 250 μm.

Yet another subject of the present invention is an electrical or electronic component having the protective organosiloxane coating applied thereon.

The present invention is elucidated in more detail by the examples hereinafter.

EXAMPLES

The examples are intended to elucidate the present invention, but in no way impose any limitation thereon.

The formulations were mixed using a Hauschild SpeedMixer of type DAC 150.1 FVZ-K.

The crosslinking was initiated by irradiation with an iron-doped mercury emitter. The UV dose was 6000 mJ/cm$^2$.

The Shore A hardness was measured using a commercial Shore A measuring instrument.

The rheological parameters, such as the viscosity of the composition, were measured using an Anton Paar Type MCR-302 Rheometer. The measurements were done at 25° C. in accordance with DIN 53019 with a concentric cylinder type B-CC25 (Z3) at a shear gradient D=10 s$^{-1}$.

Example 1

A formulation of 596 parts of a divinylpolydimethylsiloxane of viscosity 200 mPa·s (component A), 46.1 parts of a polydimethylsiloxane having an Si—H fraction of 7 mmol/g and at least 3 Si—H units per molecule (component B), 0.03 part of trimethyl(methylcyclopentadienyl)platinum (component C), 0.019 part of 1-ethynyl-1-cyclohexanol (component D), 329.5 parts of a linear polydimethylsiloxane having terminal Si—H groups (component E), 13 parts of 3-glycidyloxypropyltrimethoxysilane (component F), 0.1 part of 2,5-thiophenediylbis(5-tert-butyl-1,3-benzoxazole) (component J, fluorescer) and 10 parts of a coated fumed silica (component J, rheological assistant) is thoroughly mixed.

The mixture can be stored for three months at room temperature and within this time can be crosslinked within a few seconds by UV irradiation with a dose of 6000 mJ/cm². Directly after irradiation, the formulation forms a solid which continues to increase in hardness somewhat within one hour after irradiation. The viscosity of the unvulcanized mixture is 500 mPa·s at 25° C. and is dependent on shear rate. The Shore A hardness of the vulcanized mixture is 10.

Example 2

A formulation of 586 parts of a divinylpolydimethylsiloxane of viscosity 200 mPa·s (component A), 46.1 parts of a polydimethylsiloxane having an Si—H fraction of 7 mmol/g and at least 3 Si—H units per molecule (component B), 0.03 part of trimethyl(methylcyclopentadienyl)platinum (component C), 0.019 part of 1-ethynyl-1-cyclohexanol (component D), 329.5 parts of a linear polydimethylsiloxane having terminal Si—H groups (component E), 13 parts of 3-glycidyloxypropyltrimethoxysilane (component F), 10 parts of methylvinylcyclotetrasiloxane (component G), 0.1 part of 2,5-thiophenediylbis(5-tert-butyl-1,3-benzoxazole) (component J, fluorescer) and 10 parts of a coated fumed silica (component J, rheological assistant) is thoroughly mixed.

The mixture can be stored for three months at room temperature and within this time can be crosslinked within a few seconds by UV irradiation with a dose of 6000 mJ/cm². After irradiation, the formulation forms a solid over a period of several minutes. The viscosity of the unvulcanized mixture is 500 mPa·s at 25° C. and is dependent on shear rate. The Shore A hardness of the vulcanized mixture is 20.

Example 3

A formulation of 406.8 parts of a divinylpolydimethylsiloxane of viscosity 200 mPa·s (component A), 300 parts of a divinylpolydimethylsiloxane of viscosity 1000 mPa·s (component A), 30 parts of a polydimethylsiloxane having an Si—H fraction of 7 mmol/g and at least 3 Si—H units per molecule (component B), 0.03 part of trimethyl(methylcyclopentadienyl)platinum (component C), 0.019 part of 3,5-dimethyl-1-hexyn-3-ol (component D), 150 parts of a linear polydimethylsiloxane having terminal Si—H groups (component E), 13 parts of 3-glycidyloxypropyltrimethoxysilane (component F), 100 parts of a VQM resin (component H) and 0.1 part of 2,5-thiophenediylbis(5-tert-butyl-1,3-benzoxazole) (component J, fluorescer) is thoroughly mixed.

The mixture can be stored for three months at room temperature and within this time can be crosslinked within a few seconds by UV irradiation with a dose of 6000 mJ/cm². After irradiation, the formulation forms a solid which continues to increase in hardness somewhat within one hour after irradiation.

Example 4

A formulation of 596 parts of a divinylpolydimethylsiloxane of viscosity 200 mPa·s (component A), 46.1 parts of a polydimethylsiloxane having an Si—H fraction of 7 mmol/g and at least 3 Si—H units per molecule (component B), 0.03 part of trimethyl(methylcyclopentadienyl)platinum (component C), 0.02 part of 1-ethynylcyclohexane-1-ol (component D), 330 parts of a linear polydimethylsiloxane having terminal Si—H groups (component E), 10 parts of coated pyrogenic silicon dioxide (component J), and 0.1 part of 2,5-thiophenediylbis(5-tert-butyl-1,3-benzoxazole) (component J, fluorescer) is thoroughly mixed.

The mixture can be stored for three months at room temperature and within this time can be crosslinked within a few seconds by UV irradiation with a dose of 6000 mJ/cm². After irradiation, the formulation forms a solid which continues to increase in hardness somewhat within one hour after irradiation.

Example 5

A formulation of 2400 parts of a divinylpolydimethylsiloxane of viscosity 1000 mPa·s, 11.25 parts of a polydimethylsiloxane having an Si—H fraction of 4.3 mmol/g and at least 3 Si—H units per molecule (component B), 75 parts of a polydimethylsiloxane having an Si—H fraction of 0.9 mmol/g, 0.08 part of trimethyl(methylcyclopentadienyl) platinum (component C), and 0.05 part of 1-ethynylcyclohexane-1-ol (component D) is thoroughly mixed.

The mixture can be stored for three months at room temperature and within this time can be crosslinked within a few seconds by UV irradiation with a dose of 6000 mJ/cm². After irradiation, the formulation forms a solid which continues to increase in hardness somewhat within one hour after irradiation.

The invention claimed is:

1. A process for applying a protective compound to an electrical or electronic component, the process comprising:
    providing a one-component organosiloxane composition comprising:
    a) 20 to 98.999989 wt % of at least one linear or branched polyorganosiloxane comprising at least two alkenyl or alkynyl groups, as component A;
    b) 0.1 to 30 wt % of at least one linear or branched polyorganosiloxane comprising at least 3 Si—H groups, as component B;
    c) 0.000001 to 1 wt % of at least one UV-activatable, platinum-containing hydrosilylation catalyst, as component C;
    d) at least one alkynol of the general formula (I) present in an amount such that the viscosity of the one-component organosiloxane composition changes less than 10% when stored for at least three months at room temperature in a lightproof container but permitting curing of the composition upon UV irradiation,

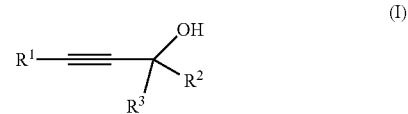
(I)

where $R^1$, $R^2$ and $R^3$ independently of one another are selected from H, C1-C6 alkyl and substituted or unsubstituted C3-C6 cycloalkyl; or
    $R^1$ is selected from H, C1-C6 alkyl and substituted or unsubstituted C3-C6 cycloalkyl, and $R^2$ and $R^3$ are connected to one another and form a 3- to 8-membered ring which may be substituted by one or more C1-C3 alkyl groups, as component D, wherein the amount of the at least one alkynol inhibits the catalyst;

e) 0 to 79.899989 wt % of one or more polyorganosiloxanes comprising two terminal Si—H groups or one terminal Si—H group and one terminal alkenyl group, as component E;
f) 0 to 20 wt % of one or more epoxy organosiloxanes, as component F;
g) 0 to 5 wt % of one or more acyclic or cyclic organosiloxanes, different from component A and having 1 to 5 Si atoms, and comprising at least two alkenyl groups, as component G;
h) 0 to 79.899989 wt % of one or more silsesquioxanes, as component H; and
i) 0 to 75 wt % of one or more additives, as component I;
where the sum of components A to I is 100 wt %;
applying the one-component organosiloxane composition to an electrical or electronic component, and
irradiating the one-component organosiloxane composition with UV light; wherein the inhibition of the catalyst is lifted by means of UV radiation.

2. The process according to claim 1, wherein component A comprises at least one linear polyorganosiloxane of the general formula (II),

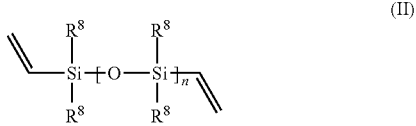

where
$R^8$ independently is selected from $C_1$-$C_6$ alkyl; and
n is a number from 6 to 1000.

3. The process according to claim 1, wherein component B is a linear polydimethylsiloxane comprising at least 3 Si—H groups.

4. The process according to claim 1, wherein component C is trimethyl(methylcyclopentadienyl)platinum.

5. The process according to claim 1, wherein component D is an alkynol of the general formula (I) where $R^1$ is H, $R^2$ is methyl and $R^3$ is selected from $C_1$-$C_6$ alkyl, or $R^2$ and $R^3$ are connected to one another and form a cyclohexane ring.

6. The process according to claim 5, component D is 2-methyl-3-butyn-2-ol, 3,5-dimethyl-1-hexyn-3-ol, or 1-ethynyl-1-cyclohexanol.

7. The process according to claim 1, wherein the UV-activatable, platinum-containing hydrosilylation catalyst comprises an optionally substituted cyclopentadienyl group as a ligand.

8. An electrical or electronic component having an organosiloxane coating, wherein the coating is obtained through curing a one-component organosiloxane composition comprising:
a) 20 to 98.999989 wt % of at least one linear or branched polyorganosiloxane comprising at least two alkenyl or alkynyl groups, as component A;
b) 0.1 to 30 wt % of at least one linear or branched polyorganosiloxane comprising at least 3 Si—H groups, as component B;
c) 0.000001 to 1 wt % of at least one UV-activatable, platinum-containing hydrosilylation catalyst, as component C;
d) at least one alkynol of the general formula (I) present in an amount such that the viscosity of the one-component organosiloxane composition changes less than 10% when stored for at least three months at room temperature in a lightproof container but permitting curing of the composition upon UV irradiation,

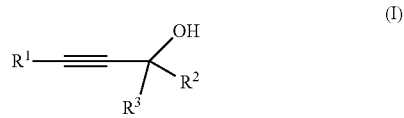

where $R^1$, $R^2$ and $R^3$ independently of one another are selected from H, C1-C6 alkyl and substituted or unsubstituted C3-C6 cycloalkyl; or
$R^1$ is selected from H, C1-C6 alkyl and substituted or unsubstituted C3-C6 cycloalkyl, and $R^2$ and $R^3$ are connected to one another and form a 3- to 8-membered ring which may be substituted by one or more C1-C3 alkyl groups, as component D;
e) 0 to 79.899989 wt % of one or more polyorganosiloxanes comprising two terminal Si—H groups or one terminal Si—H group and one terminal alkenyl group, as component E;
f) 0 to 20 wt % of one or more epoxy organosiloxanes, as component F;
g) 0 to 5 wt % of one or more acyclic or cyclic organosiloxanes, different from component A and having 1 to 5 Si atoms, and comprising at least two alkenyl groups, as component G;
h) 0 to 79.899989 wt % of one or more silsesquioxanes, as component H; and
i) 0 to 75 wt % of one or more additives, as component I;
where the sum of components A to I is 100 wt %.

9. The electrical or electronic component according to claim 8 wherein the one-component organosiloxane composition is cured using UV-radiation.

10. The electrical or electronic component according to claim 8, wherein the electrical or electronic component includes one or more of an electrical wire, an electrical winding, a circuit board, or an electronic assembly.

11. An electrical or electronic component impregnated in an organosiloxane compound, wherein the compound is obtained through curing a one-component organosiloxane composition comprising:
a) 20 to 98.999989 wt % of at least one linear or branched polyorganosiloxane comprising at least two alkenyl or alkynyl groups, as component A;
b) 0.1 to 30 wt % of at least one linear or branched polyorganosiloxane comprising at least 3 Si—H groups, as component B;
c) 0.000001 to 1 wt % of at least one UV-activatable, platinum-containing hydrosilylation catalyst, as component C;
d) at least one alkynol of the general formula (I) present in an amount such that the viscosity of the one-component organosiloxane composition changes less than 10% when stored for at least three months at room temperature in a lightproof container but permitting curing of the composition upon UV irradiation,

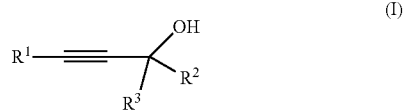

where $R^1$, $R^2$ and $R^3$ independently of one another are selected from H, C1-C6 alkyl and substituted or unsubstituted C3-C6 cycloalkyl; or $R^1$ is selected from H, C1-C6 alkyl and substituted or unsubstituted C3-C6 cycloalkyl, and $R^2$ and $R^3$ are connected to one another and form a 3- to 8-membered ring which may be substituted by one or more C1-C3 alkyl groups, as component D;

e) 0 to 79.899989 wt % of one or more polyorganosiloxanes comprising two terminal Si—H groups or one terminal Si—H group and one terminal alkenyl group, as component E;

f) 0 to 20 wt % of one or more epoxy organosiloxanes, as component F;

g) 0 to 5 wt % of one or more acyclic or cyclic organosiloxanes, different from component A and having 1 to 5 Si atoms, and comprising at least two alkenyl groups, as component G;

h) 0 to 79.899989 wt % of one or more silsesquioxanes, as component H; and i) 0 to 75 wt % of one or more additives, as component I;

where the sum of components A to I is 100 wt %.

12. A one-component storage stable organosiloxane composition having a viscosity equal to or smaller than 5000 mPa·s, comprising a) 20 to 98.999989 wt % of at least one linear or branched polyorganosiloxane comprising at least two alkenyl or alkynyl groups, as component A;

b) 0.1 to 30 wt % of at least one linear or branched polyorganosiloxane comprising at least 3 Si—H groups, as component B;

c) 0.000001 to 1 wt % of at least one UV-activatable, platinum-containing hydrosilylation catalyst, as component C;

d) at least one alkynol of the general formula (I) present in an amount such that the viscosity of the one-component organosiloxane composition changes less than 10% when stored for at least three months at room temperature in a lightproof container but permitting curing of the composition upon UV irradiation,

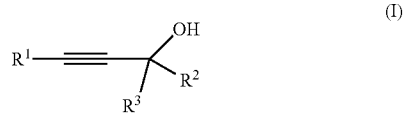

(I)

where $R^1$, $R^2$ and $R^3$ independently of one another are selected from H, C1-C6 alkyl and substituted or unsubstituted C3-C6 cycloalkyl; or $R^1$ is selected from H, C1-C6 alkyl and substituted or unsubstituted C3-C6 cycloalkyl, and $R^2$ and $R^3$ are connected to one another and form a 3- to 8-membered ring which may be substituted by one or more C1-C3 alkyl groups, as component D, wherein the amount of the at least one alkynol inhibits the catalyst;

e) 0 to 79.899989 wt % of one or more polyorganosiloxanes comprising two terminal Si—H groups or one terminal Si—H group and one terminal alkenyl group, as component E;

f) 0 to 20 wt % of one or more epoxy organosiloxanes, as component F;

g) 0 to 5 wt % of one or more acyclic or cyclic organosiloxanes, different from component A and having 1 to 5 Si atoms, and comprising at least two alkenyl groups, as component G;

h) 0 to 79.899989 wt % of one or more silsesquioxanes, as component H; and i) 0 to 75 wt % of one or more additives, as component I;

where the sum of components A to I is 100 wt %.

13. A process for applying a protective compound to an electrical or electronic component, the process comprising:

providing the one-component organosiloxane composition of claim 12, applying the one-component organosiloxane composition to an electrical or electronic component, and irradiating the one-component organosiloxane composition with UV light, wherein the inhibition of the catalyst is lifted by means of UV radiation.

* * * * *